United States Patent
Jang et al.

[11] Patent Number: 6,090,696
[45] Date of Patent: Jul. 18, 2000

[54] METHOD TO IMPROVE THE ADHESION OF A MOLDING COMPOUND TO A SEMICONDUCTOR CHIP COMPRISED WITH COPPER DAMASCENE STRUCTURES

[75] Inventors: Syun-Ming Jang; Mong-Song Liang, both of Hsin-Chu, Taiwan

[73] Assignee: Taiwan Semicondutor Manufacturing Company, Hsin-Chu, Taiwan

[21] Appl. No.: 09/421,511

[22] Filed: Oct. 20, 1999

[51] Int. Cl.$^7$ .................................................. H01L 21/44
[52] U.S. Cl. ....................... 438/617; 438/637; 438/638; 438/666; 438/668; 438/687
[58] Field of Search .................................. 438/617, 637, 438/638, 666, 668, 687

[56] References Cited

U.S. PATENT DOCUMENTS

| | | | |
|---|---|---|---|
| 5,336,456 | 8/1994 | Eskildsen et al. | 264/157 |
| 5,393,700 | 2/1995 | Wong | 437/187 |
| 5,618,381 | 4/1997 | Doan et al. | 438/633 |
| 5,659,201 | 8/1997 | Wollesen | 257/758 |
| 5,714,037 | 2/1998 | Puntambekar et al. | 156/643.1 |
| 5,785,236 | 7/1998 | Cheung et al. | 228/180.5 |
| 5,804,883 | 9/1998 | Kim et al. | 257/786 |
| 5,883,435 | 3/1999 | Geffken et al. | 257/758 |
| 5,900,668 | 5/1999 | Wollesen | 257/522 |
| 5,932,907 | 8/1999 | Grill et al. | 257/310 |
| 5,952,674 | 9/1999 | Edelstein et al. | 257/48 |
| 5,955,781 | 9/1999 | Joshi et al. | 257/712 |
| 6,033,939 | 3/2000 | Agarwala et al. | 438/132 |
| 6,033,984 | 3/2000 | Schnabel et al. | 438/638 |

*Primary Examiner*—John F. Niebling
*Assistant Examiner*—Lynne A. Gurley
*Attorney, Agent, or Firm*—George O. Saile; Stephen B. Ackerman

[57] ABSTRACT

A process used to create a non-smooth, top surface topography, for a semiconductor substrate, needed to improve the adhesion between a protective molding compound, and the underlying top surface of the semiconductor substrate, has been developed. The process features the creation of the non-smooth, top surface topography, including either: recessed, or etched back, copper damascene structures, in an insulator layer; or copper damascene structures, in a recessed, or etched back, insulator layer. The recessing of the copper damascene structures, or of the insulator layer, is accomplished via selective, dry or wet etch procedures. After formation of a gold wire bond, on the top surface of a copper damascene structure, a protective molding compound is applied, to the underlying, non-smooth, top surface topography.

18 Claims, 4 Drawing Sheets

METHOD TO IMPROVE THE ADHESION OF A MOLDING COMPOUND TO A SEMICONDUCTOR CHIP COMPRISED WITH COPPER DAMASCENE STRUCTURES

RELATED PATENT ACTIVITY

"TOP METAL AND PASSIVATION PROCEDURE FOR COPPER DAMASCENE STRUCTURES", S. M. Jang, of Taiwan Semiconductor Manufacturing Corporation, invention disclosure #TSMC98-473, assigned to a common assignee.

BACKGROUND OF THE INVENTION

(1) Field of the Invention

The present invention relates to processes used to fabricate semiconductor devices, and more specifically to a process used to improve the adhesion of a molding compound, applied after a gold wire bond procedure, to the top surface of an underlying semiconductor chip.

(2) Description of Prior Art

The use of damascene processing to obtain metal interconnect structures, has allowed more devices to be placed on a semiconductor chip, when compared to counterpart semiconductor chips, comprised using conventional patterning procedures, such as photolithography and dry etching, to form the desired metal interconnect structures. The damascene metal interconnect structure, formed in a damascene opening, in an insulator layer, via chemical mechanical polishing procedures, exhibits a smooth, top surface topography, comprised of the top surface of the damascene metal structure, and the top surface of the insulator layer, in which the damascene pattern was formed in. The smooth top surface topography is. a result of the chemical mechanical polishing procedure, performed after a metal deposition, and used to remove the region of unwanted metal, from the top surface of an insulator layer, leaving the damascene metal structure only in the damascene opening. For most wiring levels the smooth topography is an advantageous feature, allowing subsequent overlying wiring levels, to be easily formed, without complications from an underlying wiring level, exhibiting a severe topography. The smooth top surface topography, can however present difficulties, when introduced as the final, or top level, of the semiconductor chip, prior to a wire bonding procedure, and prior to applying a protective molding compound on the completed semiconductor chip. After forming wire bonds, such as gold wire bonds, to a damascene metal structure, a molding compound is applied to protect the completed semiconductor chip from subsequent mechanical operations, encountered during assembly and packaging procedures. However the smooth top surface topography presented by the damascene type metal structures, and by overlying passivation layers, degrade the adhesion between the protective molding compound, and the underlying semiconductor chip, comprised with the smooth top surface topography.

This invention will describe methods in which the adhesion of a molding compound, applied to an underlying semiconductor chip, is improved via procedures used to add topography to a top surface comprised with damascene metal structures. A first procedure will describe a method for recessing the metal damascene structure, in the damascene opening, thus increasing the severity of the top surface topography, while a second procedure will teach a method of recessing the insulator layer, surrounding the metal damascene structure, again resulting in the desired increase for the top surface topography. The non-smooth, top surface topography, allows improved adhesion between a subsequent, overlying molding compound, and the underlying semiconductor chip, to be realized. Prior art, such as Kim et al, in U.S. Pat. No. 5,804,883, and Eskidlsen et al, in U.S. Pat. No. 5,336,456, describe procedures to reduce stress, and to reduce fracture, of molding compounds, however these prior arts do not describe the procedures used to create the non-smooth, top surface topography, needed to improve the adhesion of the molding compound, to underlying surfaces.

SUMMARY OF THE INVENTION

It is an object of this invention to apply a protective, molding compound, to the underlying, top surface of a semiconductor chip, where the top surface of the semiconductor chip is comprised with metal damascene structures, in an insulator layer.

It is another object of this invention to create a non-smooth topography, for the top surface of the semiconductor chip, prior to the application of the molding compound.

It is still another object of this invention to create the non-smooth topography, for the top surface of the semiconductor chip, by either recessing the metal damascene structures, to a level below the top surface of the insulator layer in which the metal damascene structure was formed in, or by recessing the insulator layer to a level below the top surface of the metal damascene structures.

In accordance with the present invention a method for preparing a top surface, of a semiconductor substrate, comprised of metal damascene structures, in an insulator layer, for an overlying, protective, molding compound, is described. Metal damascene structures are formed in openings in an insulator layer, via deposition of a metal layer, followed by removal of the metal layer, from the top surface of the insulator layer, via a chemical mechanical polishing procedure, resulting in a smooth top surface topography, comprised of the top surface of the insulator layer, and the top surface of the metal damascene structures. A first procedure used to prepare, or to create a non-smooth, top surface topography, consists of a selective dry, or wet etch procedure, used to recess the metal damascene structure, to a level below the top surface of the insulator layer. A second procedure used to create a non-smooth, top surface topography, for the semiconductor chip, is to selectively recess, or remove, insulator layer, to a level below the top surface of the metal damascene structures. After deposition of a composite insulator layer, on the non-smooth, top surface topography, an opening is made in the composite insulator layer, exposing the top surface of a wide diameter, metal damascene structure, used as a bonding pad. A gold wire is next bonded to the exposed top surface of the wide diameter, metal damascene structure, followed by the formation of a protective molding compound, applied to the non-smooth top surface of the semiconductor chip, used to passivate the semiconductor chip, prior to packaging procedures, and with improved adhesion of the molding compound, to the semiconductor chip, as a result of the increased topography created by the recessing procedures, performed to either the metal damascene structures, or to the insulator layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of creating a non-smooth topography, for the top surface of a semiconductor chip, to improve the adhesion of an overlying, protective molding compound, to the top surface of the semiconductor chip, will now be described in detail. This invention will describe the preparation of a top surface of a semiconductor chip, in which the top surface of the semiconductor chip is comprised of metal damascene structures, formed in an insulator layer. Although not shown, or described in this invention, the described metal damascene structures, contact underlying metal wiring levels, which in turn communicate with active device regions, in a semiconductor substrate. However the description of this invention will focus only on the upper level wiring configuration, comprised of metal damascene structures, which in addition to communicating with underlying metal levels, and with the semiconductor substrate, are used to accept a gold wire bond, used to connect the finished semiconductor chip, to external packaging structures.

Figure 1:
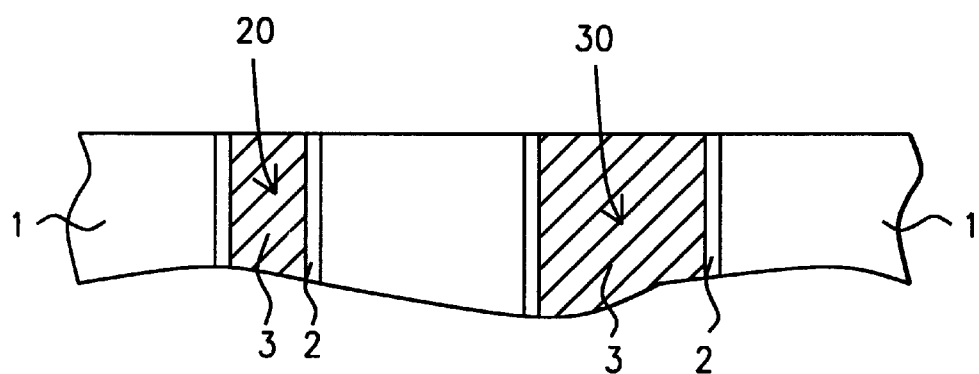
FIGS. 1–9, which schematically, in cross-sectional style, show the key stages, of two procedures used to create a non-smooth, top surface topography, for a semiconductor chip, that is needed to improve the adhesion of a protective molding compound, to an underlying semiconductor chip.

FIG. 1, schematically shows damascene openings 20, and 30, in insulator layer 1. Insulator 1, can be comprised of silicon oxide, borosilicate glass, or borophosphosilicate glass. The damascene openings are created via conventional photolithographic and anisotropic, reactive ion etching, (RIE), procedures, using $CHF_3$ as an etchant for insulator layer 1. If desired, dual damascene openings, can be formed in insulator 1, using a series of photolithographic and RIE procedures, forming a wide diameter component, and a narrow diameter component, for the dual damascene structures. For purposes of this invention, two damascene openings will be formed, a narrow diameter opening 20, and a wider diameter opening 30, to be used to accommodate a wide diameter, metal damascene structure, that will be used to accept the subsequent wire bond. Underlying conductive regions, such as lower level metal interconnect structures, and metal via structures, are exposed at the bottom of the damascene openings. These are not shown in FIG. 1, or throughout the remaining drawings.

A barrier layer 2, comprised of tantalum, or tantalum nitride, is first deposited, via R.F. sputtering procedures, at a thickness between about 200 to 400 Angstroms. Barrier layer 2, lining the sides of damascene openings 20, and 30, will protect the surrounding regions, such as insulator 1, from copper poisoning, when the copper damascene structures are subsequently formed in the damascene openings. A copper seed layer is next deposited, via R.F. sputtering procedures, to a thickness between about 800 to 1200 Angstroms, followed by an electroplated copper deposition, between about 10000 to 12000 Angstroms, completely filling damascene openings 20, and 30. A chemical mechanical polishing procedure is next used to remove unwanted regions of the copper layer from the top surface of insulator layer 1, creating narrow diameter,copper damascene structure 3a, in narrow damascene opening 20, and wide diameter, copper damascene structure 3b, in wide damascene opening 30. The diameter of wide diameter, copper damascene structure 3b, to be used as a bonding pad, for a subsequent gold wire bond, is between about 50 to 120 um. This is schematically shown in FIG. 1.

After deposition of a composite insulator layer, on the smooth top surface topography, which is comprised of the top surface of insulator 1, and the top surface of the copper damascene structures, an opening is made in the composite insulator layer, exposing a region of the top surface of copper damascene structure 3b, allowing a gold wire bond to be formed on the top surface of copper damascene structure 3b. This is followed by the application of a molding compound, used to protect the semiconductor elements from mechanical, as well as chemical procedures, used to package the semiconductor chips. However the smooth top surface topography, created during the damascene processing procedures, does not allow the needed adhesion of the overlying, molding compound, to the underlying, top surface of the semiconductor chip, to be realized. Therefore procedures used to prepare the smooth top surface for an overlying application of a molding compound, or the procedures used to create a non-smooth top surface topography, will now be described.

Figure 2:
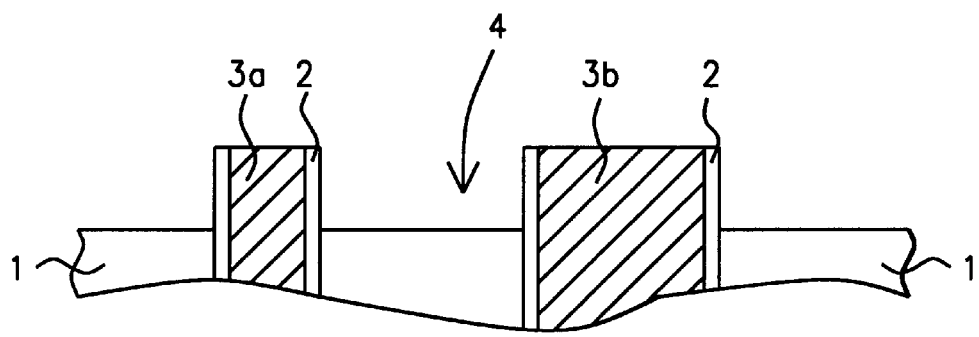

FIG. 2, schematically shows the result of an insulator etchback procedure, used to recess insulator layer 1, to a level below the top surface of the copper damascene structures. This is accomplished using a selective, reactive ion etching, (RIE), procedure, using $CHF_3$ as an etchant. The etch rate ratio of insulator layer 1, silicon oxide, to copper, or to barrier layer 2, using $CHF_3$ etchant, is about 50 to 1, allowing recess 4, to be formed in insulator layer 1, extending between about 1000 to 3000 Angstroms, below the top surface of the copper damascene structures. Recess 4, can also be obtained via use of a selective wet etch procedure, using a buffered hydrofluoric acid solution to selectively remove the desired amount of insulator layer 1, to achieve recess 4. The buffered hydrofluoric acid solution does not etch the exposed regions of the copper damascene structures, nor does it etch exposed regions of barrier layer 2.

Figure 3:
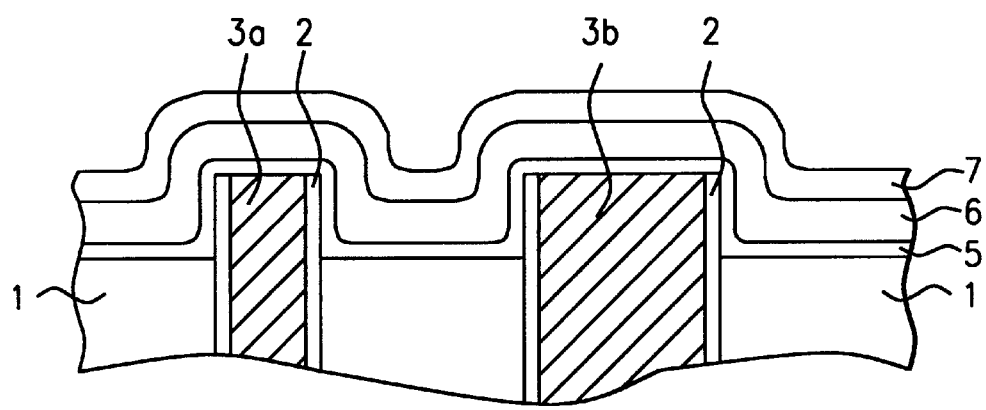
Figure 4:
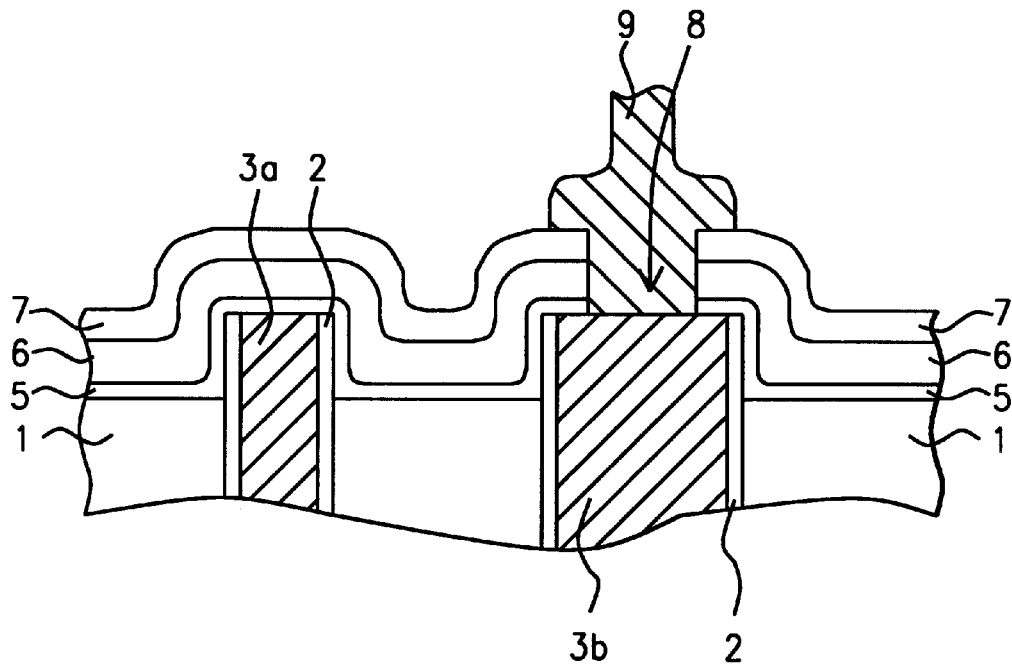

A passivation layer, or a composite insulator layer, shown schematically in FIG. 3, is next deposited on the non-smooth top surface topography, of the semiconductor chip, resulting from the formation of recess 4. The composite insulator layer is comprised of: an underlying silicon nitride layer 5, obtained via plasma enhanced chemical vapor deposition, (PECVD), procedures, at a thickness between about 300 to 600 Angstroms; silicon oxide layer 6, obtained via PECVD procedures, at a thickness between about 2000 to 4000 Angstroms; and an overlying silicon nitride layer 7, obtained via PECVD procedures, at a thickness between about 5000 to 7000 Angstroms. Conventional photolithographic and RIE procedures, using $CHF_3$ or $CF_4$ as an etchant, are next used to create opening 8, in the composite insulator layer, exposing a portion of the top surface of wide diameter, copper damascene structure 3b. This is schematically shown in FIG. 4. After removal of the photoresist shape, used to define opening 8, gold wire 9, schematically shown in FIG. 4, is bonded to the exposed surface of wide diameter, copper damascene structure 3b.

Figure 5:
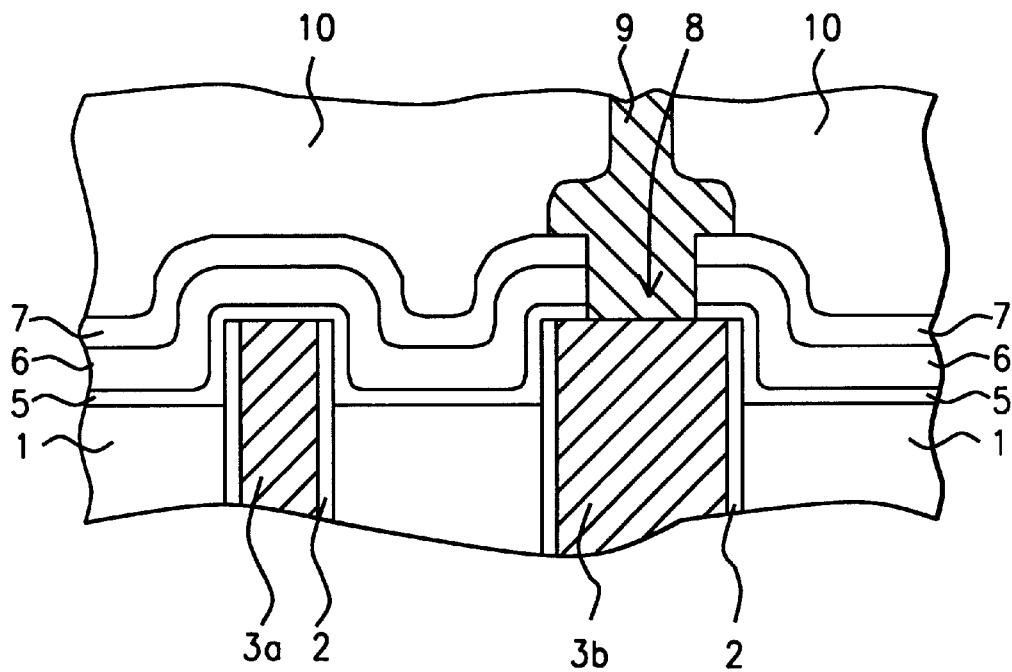

Finally a molding compound 10, such as an epoxy material, plus filler, and hardener, is applied at a thickness between about 1.0 to 1.5 um, via spin on procedures. Molding compound 10, schematically shown in FIG. 5, is used to protect the semiconductor chip during dicing, and packaging procedures. However to optimally apply molding compound 10, and to achieve the desired adhesion of the molding compound, to the underlying materials, the topography, or roughness, of the top surface, of the semiconductor chip, had to b e increased, via the recessing of insulator layer 1.

Figure 6:
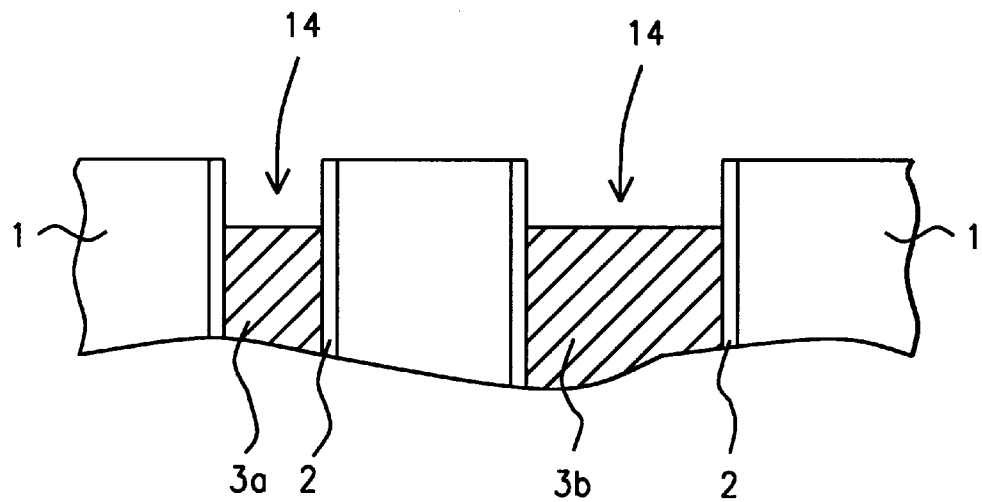

A second method for creating a non-smooth, top surface topography, for the semiconductor chip, via a metal etchback procedure, is next described. Referring to the smooth top surface topography, previously shown schematically in FIG. 1, the recessing of the copper component, of copper damascene structures 20, and 30, is accomplished via wet procedures, using $HNO_3$, at a temperature between about 80 to 1290° C., to remove copper, while not attacking insulator layer 1, or barrier layer 2 Recess 14, shown schematically in FIG. 6, extends between about 1000 to 3000 Angstroms, below the top surface of insulator layer 1. Recess 14, can also be achieved via a selective RIE procedure, using $Cl_2$ as an etchant. The etch rate ratio of copper to insulator layer 1, is between about 30 to 1.

Figure 7:
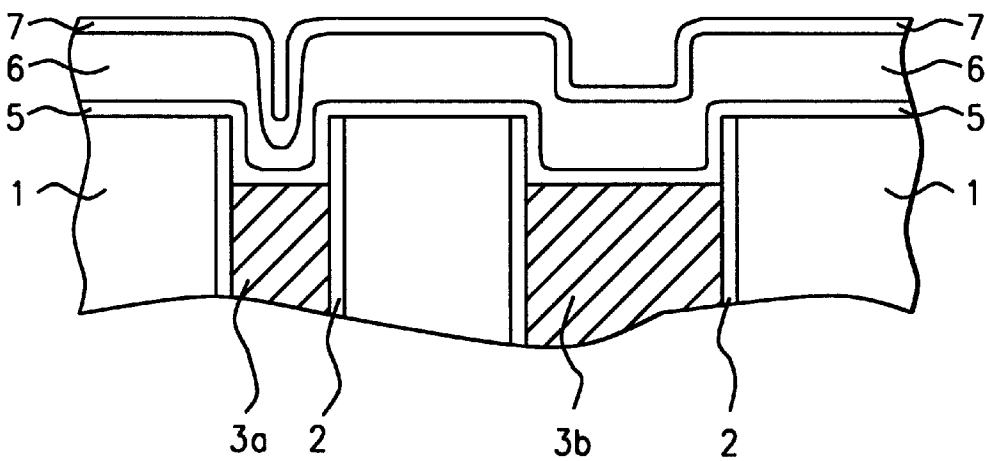
Figure 8:
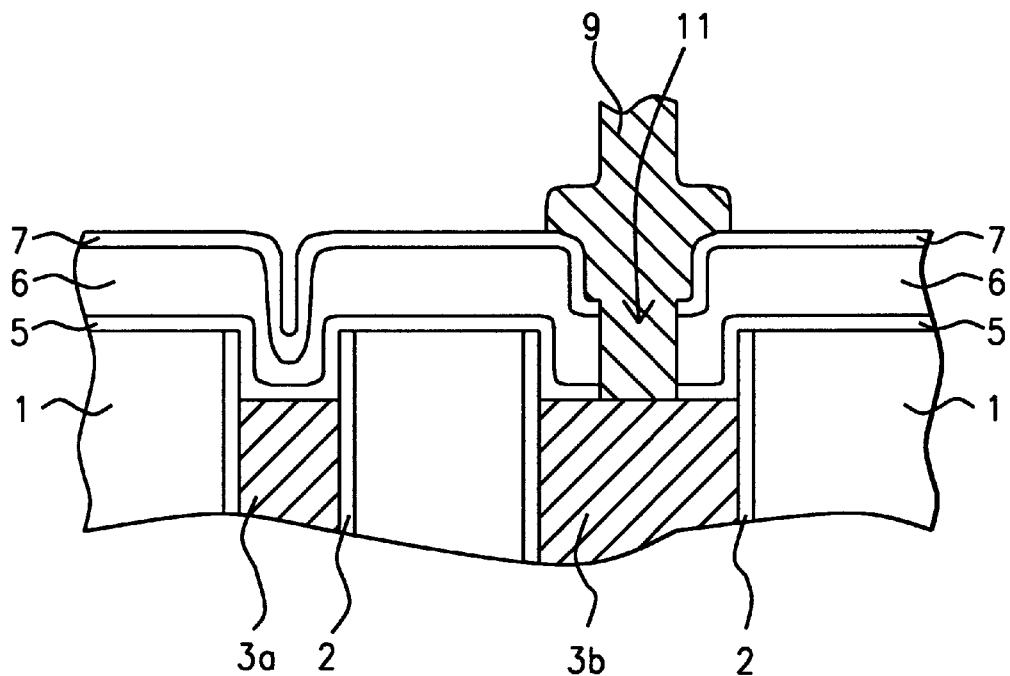
Figure 9:
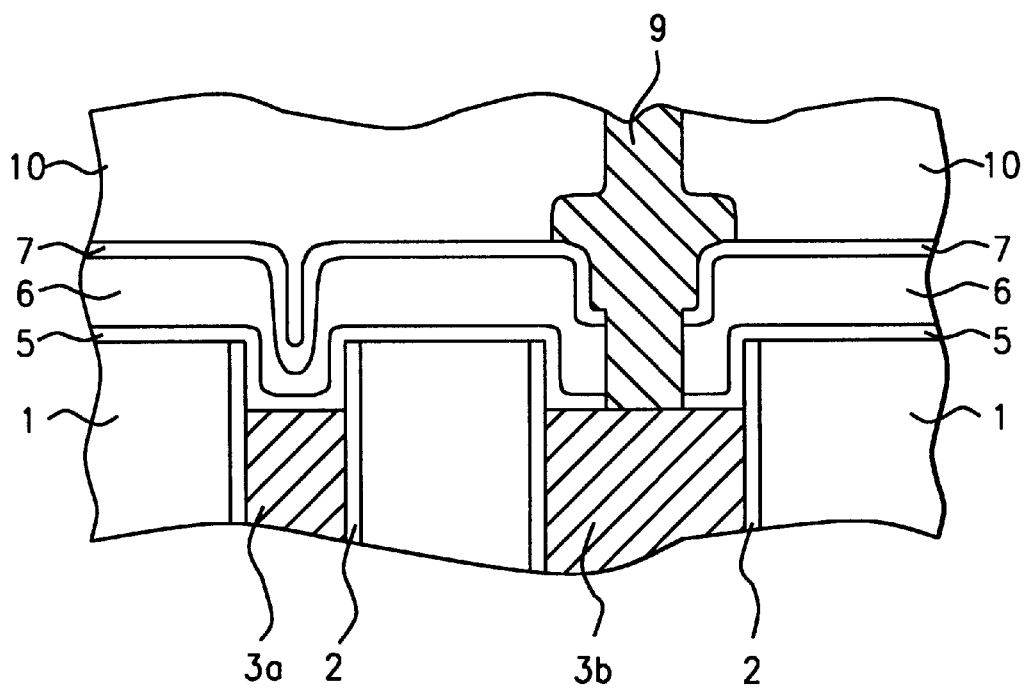

FIGS. 7–9, schematically show the key fabrication stages used to form the gold wire bond, and the molding compound. A composite insulator layer, identical to the composite insulator layer, previously shown and described in FIG. 3, is again deposited overlying the non-smooth, top surface topography, of the semiconductor chip, however with the non-smooth, top surface topography, for this case created via a metal etchback procedure. This is schematically shown in FIG. 7. Conventional photolithographic and RIE procedures, are again used to create opening 11, in the composite insulator layer, exposing a portion of the recessed, top surface, of wide diameter, copper damascene structure 3b. After removal of the photoresist shape, used to define opening 11, via plasma oxygen ashing and careful wet cleans, gold wire 9, is bonded to the exposed portion of the recessed, top surface of wide diameter, copper damascene structure 3b. This is schematically shown in FIG. 8. Protective molding compound 10, schematically shown in FIG. 9, is then applied, with the desired adhesion to the underlying, non-smooth, top surface topography, of the semiconductor chip, achieved via the creation of the recessing of the copper damascene structures.

While this invention has been particularly shown and described with reference to, the preferred embodiments thereof, it will be understood by those skilled in the art that various changes in form and detail may be made without departing from the spirit and scope of this invention.

What is claimed is:

1. A method for forming a molding compound on a non-smooth, top surface topography, of a semiconductor substrate, comprising the steps of:

forming metal damascene structures, including a wide diameter, metal damascene structure, in an insulator layer, resulting in a smooth, top surface topography, for said semiconductor substrate, with said smooth, top surface topography resulting from the top surface of said metal damascene structures, located at the same level as the top surface of said insulator layer;

selectively removing a top portion, of said metal damascene structures, to create said non-smooth top surface topography, for said semiconductor substrate, with said non-smooth, top surface topography resulting from recessed metal damascene structures, in said insulator layer, and with the top surface of said recessed metal damascene structures, at a level below the top surface of said insulator layer;

depositing a composite insulator layer on said non-smooth top surface topography;

forming an opening in said composite insulator layer, exposing a portion of the top surface of said wide diameter, recessed metal damascene structure;

forming a wire bond on the portion of said wide diameter, recessed metal damascene structure, exposed in said opening, in said composite insulator layer; and applying said molding compound on said composite insulator layer, with said molding compound surrounding said wire bond.

2. The method of claim 1, wherein said metal damascene structures are formed in damascene openings, in said insulator layer, with a barrier layer of tantalum, or tantalum nitride, at a thickness between about 200 to 400 Angstroms, lining the sides of the damascene openings, in said insulator layer.

3. The method of claim 1, wherein said metal damascene structures, are comprised of copper, obtained via deposition of a copper seed layer, via R.F. sputtering procedures, at a thickness between about 800 to 1200 Angstroms, followed by the deposition of an electroplated copper layer, at a thickness between about 10000 to 12000 Angstroms.

4. The method of claim 1, wherein said smooth, top surface topography, of said semiconductor substrate, comprised of the top surfaces of said metal damascene structures, and the top surface of said insulator layer, is obtained via a chemical mechanical polishing procedure, used to form said metal damascene structures, in the damascene openings in the insulator layer, via removal of metal from the top surface of said insulator layer.

5. The method of claim 1, wherein said recessed metal damascene structures are formed via the selective removal of between about 1000 to 3000 Angstroms of copper, from the top surface of said metal damascene structures, using a $HNO_3$ solution, at a temperature between about 80 to 120° C.

6. The method of claim 1, wherein said recessed metal damascene structures are formed via the selective removal of between about 1000 to 3000 Angstroms of copper, from the top surface said metal damascene structures, via a RIE procedure, using $Cl_2$ as an etchant, with the etch rate ratio, of copper to silicon oxide, between about 30 to 1.

7. The method of claim 1, wherein said composite insulator layer is comprised of an underlying silicon nitride layer, obtained via PECVD procedures, at a thickness between about 300 to 600 Angstroms, a silicon oxide layer, obtained via PECVD procedures, at a thickness between about 2000 to 4000 Angstroms, and an overlying silicon nitride layer, obtained via PECVD procedures, at a thickness between about 5000 to 7000 Angstroms.

8. The method of claim 1, wherein said opening, in said composite insulator layer, exposing a portion of the top surface of said wide diameter, recessed metal damascene structure, is created via an anisotropic RIE procedure, using $CHF_3$ or $CF_4$ as an etchant.

9. The method of claim 1, wherein said wire bond, formed on the top surface of said wide diameter, recessed metal damascene structure, is a gold wire bond.

10. The method of claim 1, wherein said molding compound is an epoxy material, with a filler and hardener, applied via spin on procedures, to a thickness between about 1.0 to 1.5 um.

11. A method of forming a molding compound, on a non-smooth, top surface topography of a semiconductor substrate, comprised of copper damascene structures, in a recessed, insulator layer, comprising the steps of:

forming said copper damascene structures, including a wide diameter, copper damascene structure, in an insulator layer, resulting in a smooth, top surface topography, of said semiconductor substrate, comprised of the top surface of said copper damascene structures, located at the same level as the top surface of said insulator layer;

selectively removing a top portion of said insulator layer, resulting in said non-smooth, top surface topography, for said semiconductor substrate, comprised of said copper damascene structures, and of a recessed insulator layer, recessed to a level below the top surface of said copper damascene structures;

depositing a composite insulator layer on said non-smooth, top surface topography, of said semiconductor substrate;

forming an opening in said composite insulator layer, exposing a portion of the top surface of said wide diameter, copper damascene structure;

forming a gold wire bond on the region of said wide diameter, copper damascene structure, exposed in said opening, in said composite insulator layer; and applying said molding compound, on said composite insulator layer, and with said molding compound surrounding said gold wire bond.

12. The method of claim 11, wherein said copper damascene structures are formed in damascene openings, in said insulator layer, and are comprised with; a tantalum, or tantalum nitride layer, lining the sides of the damascene opening, obtained via R.F. sputtering at a thickness between about 200 to 400 Angstroms; a copper seed layer, obtained via R.F. sputtering procedures, at a thickness between about 800 to 1200 Angstroms; and an electroplated layer of copper, at a thickness between about 10000 to 12000 Angstroms.

13. The method of claim 11, wherein said smooth, top surface topography, of said semiconductor substrate, comprised of the top surfaces of said copper damascene structures, and the top surface of said insulator layer, is formed as a result of a chemical mechanical polishing procedure, used to create said copper damascene structures, in the damascene openings in said insulator layer, via removal of regions of a copper layer, from the top surface of said insulator layer.

14. The method of claim 11, wherein said insulator layer is recessed to a depth between about 1000 to 3000 Angstroms, below the top surface of said copper damascene structures, via selective removal of said insulator layer, using a buffered hydrofluoric acid solution.

15. The method of claim 11, wherein said insulator layer is recessed to a depth between about 1000 to 3000 Angstroms, below the top surface of said copper damascene structures, via selective removal of said insulator layer, via a RIE procedure, using $CHF_3$ as an etchant, with an etch rate ration of insulator layer, to copper, between about 50 to 1.

16. The method of claim 11, wherein said composite insulator layer is comprised of an underlying silicon nitride layer, obtained via PECVD procedures, at a thickness between about 300 to 600 Angstroms, a silicon oxide layer, obtained via PECVD procedures, at a thickness between about 2000 to 4000 Angstroms, and an overlying silicon nitride layer, obtained via PECVD procedures, at a thickness between about 5000 to 7000 Angstroms.

17. The method of claim 11, wherein said opening, in said composite insulator layer, is formed via an anisotropic RIE procedure, using $CHF_3$ or $CF_4$ as an etchant.

18. The method of claim 11, where said molding compound is an epoxy material, with a hardener and filler, applied via spin on procedures, at a thickness between about 1.0 to 1.5 um.

* * * * *